(12) United States Patent
Kotani (10) Patent No.: US 9,401,221 B2
(45) Date of Patent: Jul. 26, 2016

(54) SAMPLING CIRCUIT (71) Applicant: OLYMPUS CORPORATION, Shibuya-ku, Tokyo (JP)

(72) Inventor: Tadashi Kotani, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/754,332

(22) Filed: Jun. 29, 2015

(65) Prior Publication Data
US 2016/0012912 A1 Jan. 14, 2016

(30) Foreign Application Priority Data
Jul. 9, 2014 (JP) .................. 2014-141516

(51) Int. Cl.
G11C 27/02 (2006.01)
(52) U.S. Cl.
CPC ............. G11C 27/02 (2013.01); G11C 27/024 (2013.01); G11C 27/026 (2013.01)
(58) Field of Classification Search
CPC .... G11C 27/02; G11C 27/024; G11C 27/026; G01R 19/22
See application file for complete search history.

(56) References Cited

U.S. PATENT DOCUMENTS

| | | | |
|---|---|---|---|
| 7,193,224 B2 | 3/2007 | Kuroiwa et al. | |
| 7,626,529 B2* | 12/2009 | Robert | H03M 1/162 341/118 |
| 7,750,612 B2* | 7/2010 | Yokosawa | H03K 3/0231 323/282 |
| 7,839,320 B2* | 11/2010 | Feldotte | H03M 3/34 341/118 |
| 7,956,778 B2* | 6/2011 | Koyama | H03M 1/201 341/131 |
| 8,497,463 B2 | 7/2013 | Widzgowski | |
| 8,890,051 B2 | 11/2014 | Funakoshi et al. | |
| 2005/0219105 A1* | 10/2005 | Liu | H03M 3/34 341/155 |

FOREIGN PATENT DOCUMENTS

| | | |
|---|---|---|
| JP | 2000262514 A | 9/2000 |
| JP | 2001042014 A | 2/2001 |
| JP | 2006053096 A | 2/2006 |
| JP | 2011004327 A | 1/2011 |
| JP | 2013033044 A | 2/2013 |

* cited by examiner

Primary Examiner — Jung Kim
(74) Attorney, Agent, or Firm — Holtz, Holtz & Volek PC (57) ABSTRACT Sampling is continuously performed at high speed with a simple sampling circuit including a polarity switcher to invert or non-invert the polarity of an input signal; an integrating circuit to integrate the signal output from the polarity switcher to output integrated values corresponding to the amount of charge stored in a capacitor; a computing section configured to compute a sampling value every sampling period in such a manner that a difference between one of the integrated values output from the integrating circuit at the start of the sampling period and another one of the integrated values output from the integrating circuit at the end of the sampling period is multiplied by a sign corresponding to the polarity set by the polarity switcher; and a control section configured to control the polarity switcher to alternately invert the polarity of the input signal every sampling period in synchronization with a sampling cycle.

4 Claims, 6 Drawing Sheets

SAMPLING CIRCUIT

CROSS-REFERENCE TO RELATED APPLICATIONS

This application is based on Japanese Patent Application No. 2014-141516, the contents of which are incorporated herein by reference.

1. Technical Field

The present disclosure relates to a sampling circuit, and particularly relates to a sampling circuit configured to continuously perform sampling of an input signal.

2. Background Art

Conventionally, sampling circuits using integrating circuits have been known. In the sampling circuit of this type, when sampling is temporally continuously performed, discharging is required every sampling period in order to prevent saturation of the integrating circuit. However, integration cannot be performed during discharging. For such a reason, e.g., when sampling is performed at an extremely-short sampling interval of about several tens of nanoseconds, it is difficult to continuously perform sampling at high repetition.

For the abovementioned reasons, PTL 1 discloses the following technique: an external power source is connected to an input terminal of a capacitor of an integrating circuit via a switch, and the switch is turned ON in discharging to connect the power source and the capacitor together, thereby increasing the speed of discharging.

Moreover, PTL 2 discloses the technique of providing a plurality of integrating circuits in order to perform sampling at high speed.

CITATION LIST

Patent Literature

{PTL 1}
Japanese Unexamined Patent Application, Publication No. 2011-004327
{PTL 2}
Japanese Unexamined Patent Application, Publication No. 2000-262514

SUMMARY OF INVENTION

Technical Problem

The present is continuously perform sampling at high speed with a simple configuration.

Solution to Problem

The present disclosure employs the following means.

One aspect of the present disclosure is a sampling circuit including an input section configured to input an input signal; a polarity switcher configured to invert or non-invert the polarity of the input signal to the input section; an integrating circuit configured to integrate the signal output from the polarity switcher to output integrated values; a computing section configured to compute a sampling value every predetermined sampling period, the sampling value being obtained in such a manner that a difference value between an integrated value which is one of the integrated values output from the integrating circuit at the start of the sampling period and an integrated value which is another one of the integrated values output from the integrating circuit at the end of the sampling period is multiplied by a sign corresponding to the polarity set by the polarity switcher; and a control section configured to control the polarity switcher to alternately invert the polarity of the input signal every sampling period in synchronization with a sampling cycle.

According to the abovementioned aspect, the polarity switcher inverts or non-inverts the polarity of the input signal to the input section. In the integrating circuit, the charge corresponding to the signal input from the polarity switcher is stored, and the integrated value corresponding to the amount of charge stored in the integrating circuit is output. The computing section computes the sampling value every sampling period in such a manner that the difference value in integrated value output from the integrating circuit between the start of the sampling period and the end of the sampling period is multiplied by the sign corresponding to the polarity set by the polarity switcher.

In this case, since the control section controls the polarity switcher to alternately invert the polarity of the input signal every sampling period in synchronization with the sampling cycle, an integration direction in the integrating circuit is reversed in continuous sampling periods. That is, in the integrating circuit, the integration direction is alternately reversed during continuous sampling periods. Thus, saturation in the integrating circuit can be avoided. Moreover, since it is not necessary to reset the integrating circuit every unit sampling period, sampling can be continuously performed at high speed.

In addition, since a circuit configuration for resetting the integrating circuit every sampling period is not required, the number of components of the entire sampling circuit can be reduced, and therefore, the circuit configuration of the sampling circuit can be simplified. Further, since the end of the sampling period and the start of the succeeding sampling period are coincident with each other, sampling can be continuously performed with a shortened dead time.

DESCRIPTION OF EMBODIMENTS

First Embodiment

A sampling circuit of a first embodiment of the present disclosure will be described below with reference to drawings.

Figure 1:
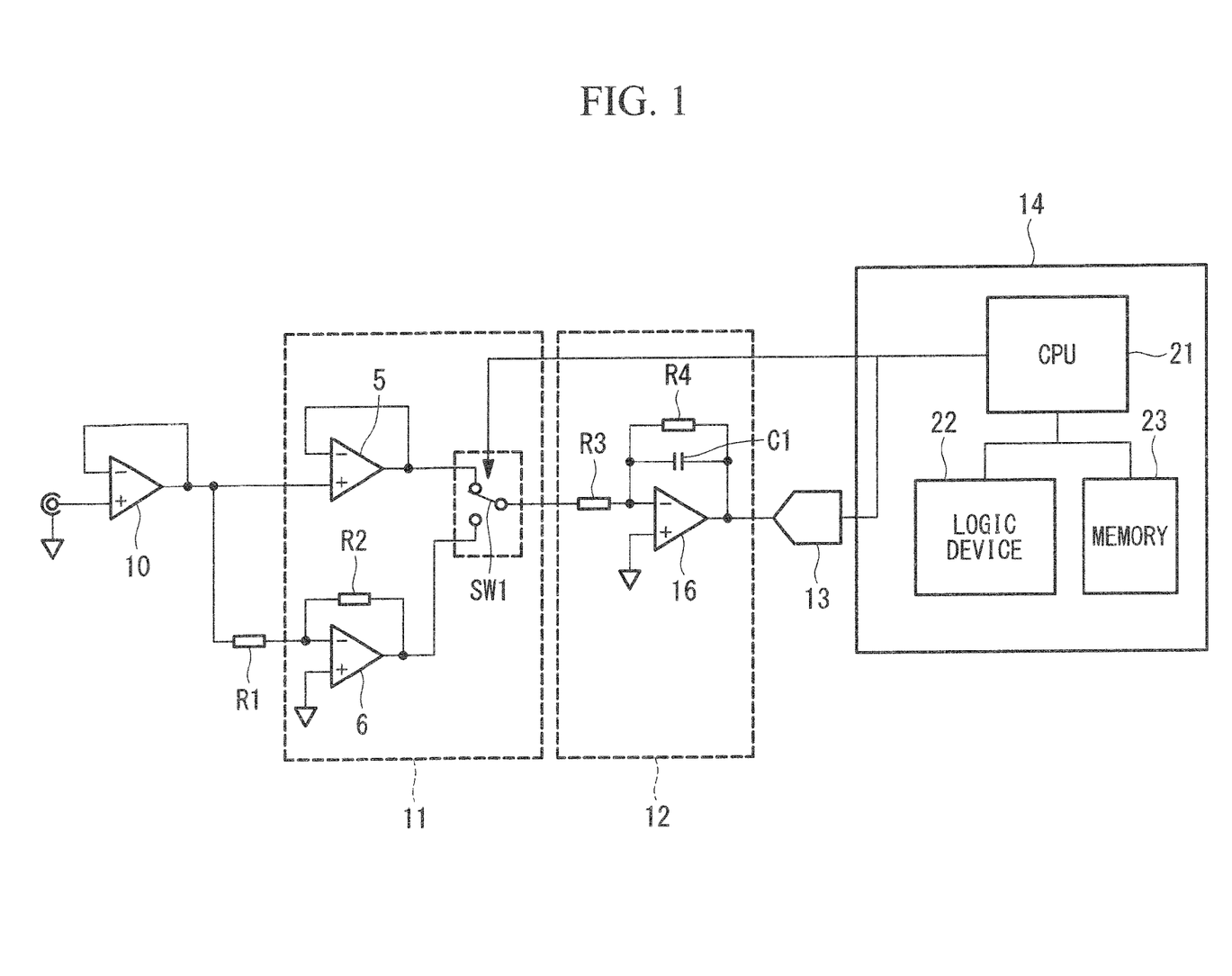
FIG. 1 is a schematic configuration diagram of a sampling circuit of a first embodiment of the present disclosure.

The sampling circuit of the present embodiment includes, as illustrated in FIG. 1, an input buffer 10 configured to input an input signal, a polarity switcher 11 configured to invert or non-invert the polarity of the input signal, an integrating circuit 12 configured to integrate the input signal, which has been output from the input buffer 10 and the polarity of which has been properly switched by the polarity switcher 11, with respect to time to output an integrated value, an A/D converter 13 configured to perform A/D conversion of the integrated value of the input signal output from the integrating circuit 12, and an arithmetic processor 14 configured to obtain a sampling value from the integrated value A/D-converted by the A/D converter 13 and to control the polarity switcher 11.

The input buffer 10 outputs an input signal, having been input from a signal source, to the polarity switcher 11. As illustrated in FIG. 1, in the present embodiment, a voltage follower using an operational amplifier is applied for the input buffer 10. A terminating resistor may be added to the input buffer 10 to adjust the impedance matching with the signal source of the input signal, or an inverting amplifier may be used as the input buffer 10.

The polarity switcher 11 includes an operational amplifier 5 as a non-inverting amplifier circuit and an operational amplifier 6 as an inverting amplifier circuit. The operational amplifiers 5, 6 each include an inverting input terminal (−), a non-inverting input terminal (+), and an output terminal. In particular, the operational amplifier 6 is, on an input side of the inverting input terminal (−), connected to a resistor R1 in series, and a resistor R2 is connected in parallel between the inverting input terminal (−) and the output terminal of the operational amplifier 6. Note that the resistors R1, R2 are the same as each other in a resistance.

Moreover, in the polarity switcher 11, a multiplexor SW1 is, as a switch, connected to output sides of the operational amplifiers 5, 6 so that the operational amplifier from which a signal is output to the integrating circuit 12 is switched between the operational amplifier 5 and the operational amplifier 6 by a later-described control signal from the arithmetic processor 14.

In other words, when the arithmetic processor 14 outputs a low-level control signal to the multiplexor SW1, the operational amplifier 5 is selected to output a signal to the integrating circuit 12. On the other hand, when the arithmetic processor 14 outputs a high-level control signal to the multiplexor SW1, the operational amplifier 6 is selected to output a signal to the integrating circuit 12.

The integrating circuit 12 includes an operational amplifier 16 functioning as an amplifier circuit, a capacitor C1 configured to store the charge corresponding to the input signal, a resistor R3 provided on an input side of the operational amplifier 16 and configured to convert a voltage signal as the input signal into a charge signal to be stored in the capacitor C1, and a resistor R4 configured to prevent saturation of the integrating circuit 12 due to the offset of the operational amplifier 16.

The product of the capacitance of the capacitor C1 and the resistance of the resistor R4 is set sufficiently greater than the inverse of the frequency in the frequency band of the input signal and the integration period. Moreover, the integrating circuit 12 of the present embodiment integrates an input with a sign (+) in a negative direction. Thus, in the present embodiment, the polarity of the input signal from the operational amplifier 6 is defined as (+), and the polarity of the input signal from the operational amplifier 5 is defined as (−).

The operational amplifier 16 includes an inverting input terminal (−), a non-inverting input terminal (+), and an output terminal. The capacitor C1 is connected in between the inverting input terminal (−) and the output terminal of the operational amplifier 16. The non-inverting input terminal (+) of the operational amplifier 16 is connected to the ground.

The A/D converter 13 performs A/D conversion of the integrated value of the input signal in synchronization with a not-shown predetermined timing signal (A/D conversion CLK) to output the converted signal to the arithmetic processor 14.

The arithmetic processor 14 controls the A/D converter 13 to obtain a sampling value from the integrated value A/D-converted by the A/D converter 13, as well as controlling the polarity switcher 11. Thus, the arithmetic processor 14 includes a CPU 21 configured to perform, e.g., control of each of the abovementioned sections and arithmetic processing of the integrated value of the input signal, a logic device 22 such as a field programmable gate array (FPGA), and a memory 23 configured to store, e.g., various signals input to the CPU 21.

The CPU 21 outputs, every sampling period, the high-level or low-level control signal synchronized with a sampling cycle to the polarity switcher 11, thereby alternately inverting the polarity of the input signal every sampling period. That is, the CPU 21 defines a predetermined sampling cycle for sampling the input signal, and alternately outputs, in synchronization with the predetermined sampling cycle, the high-level and low-level control signals to the polarity switcher 11 every sampling period to switch the multiplexor SW1. Then, the operational amplifier from which the input signal is output is alternately switched between the operational amplifier 5 and the operational amplifier 6.

Of the integrated values of the input signal output from the A/D converter 13, the difference between the integrated value at the start of a unit sampling period and the integrated value at the end of the unit sampling period in the integrating circuit 12 is computed by the CPU 21, thereby obtaining a difference value. Subsequently, the difference value is multiplied by a sign corresponding to the polarity of the polarity switcher 11, and as a result, a sampling value is computed and output. Note that in the description below, a time at the start of the unit sampling period is denoted by "T0," and a time at the start or end of the unit sampling period is denoted by "Tn" (where n=1, 2, . . . k). The sampling period whose end time is Tn is referred to as a "n-th sampling period.

The memory 23 stores the integrated values, subjected to arithmetic processing performed by the CPU 21, of the input signal at the sampling start time Tn and a sampling end time Tn+1, and the sampling value obtained for each sampling period by arithmetic processing.

The function of the sampling circuit configured as described above will be described below.

When sampling is performed by the sampling circuit of the present embodiment, an input signal such as a current signal is first input to the polarity switcher 11 via the input buffer 10.

In the polarity switcher 11, the input signal is input to the operational amplifiers 5, 6, and a control signal synchronized with a sampling period is input from the CPU 21 of the arithmetic processor 14 to the multiplexor SW1. Then, either output of the operational amplifier 5 or the operational amplifier 6 is output from the multiplexer SW1 according to the control signal.

When the input signal from either one of the operational amplifiers 5, 6 is input to the integrating circuit 12, the resistor R3 converts the input signal into a charge to be stored in the capacitor C1, and then, the charge corresponding to the input signal is stored in the capacitor C1. The integrated value of the input signal corresponding to the amount of charge stored in the capacitor C1 is output to the A/D converter 13 via the output terminal of the operational amplifier 16.

After charging the capacitor C1 for the unit sampling period, the integrated value of the input signal at the end time Tn+1 of the sampling period is stored in the memory 23. Then, a control signal for a succeeding sampling period is output from the CPU 21 to the multiplexor SW1 in synchronization with the start of the succeeding sampling period. The control signal output from the CPU 21 at this point is a control signal with the polarity opposite to that in the preceding sampling period. Thus, the input signal is input to the integrating circuit 12 during the continuous sampling periods such that the polarity of the input signal is alternately inverted. Thus, in the sampling circuit, the integration direction in the integrating circuit 12 is reversed every sampling period, and such reversing of the integration direction is repeated.

The CPU 21 controls the A/D converter 13 to perform A/D conversion of the integrated value of the input signal input from the integrating circuit 12, and then the A/D-converted integrated value of the input signal is output to the arithmetic processor 14. Of the integrated values of the input signal output from the A/D converter 13, the difference between the integrated values at the start time Tn and the end time Tn+1 of the unit sampling period is computed by the arithmetic processor 14.

In the present embodiment, the end time of the preceding sampling period and the start time of the succeeding sampling period are the same between the continuous sampling periods. That is, the end time of the n-th sampling period and the start time of the n+1-th sampling period are the same as each other. Thus, the output value from the integrating circuit 12 at the start or end time of the sampling period constantly stored in the memory 23 allows computation of a difference value of the integration values at the start and end times of the unit sampling period.

Then, when the difference value is obtained by the CPU 21, the difference value is multiplied by the polarity of the input signal in the target sampling period, and then, the obtained value is output as a sampling value.

Figure 2:
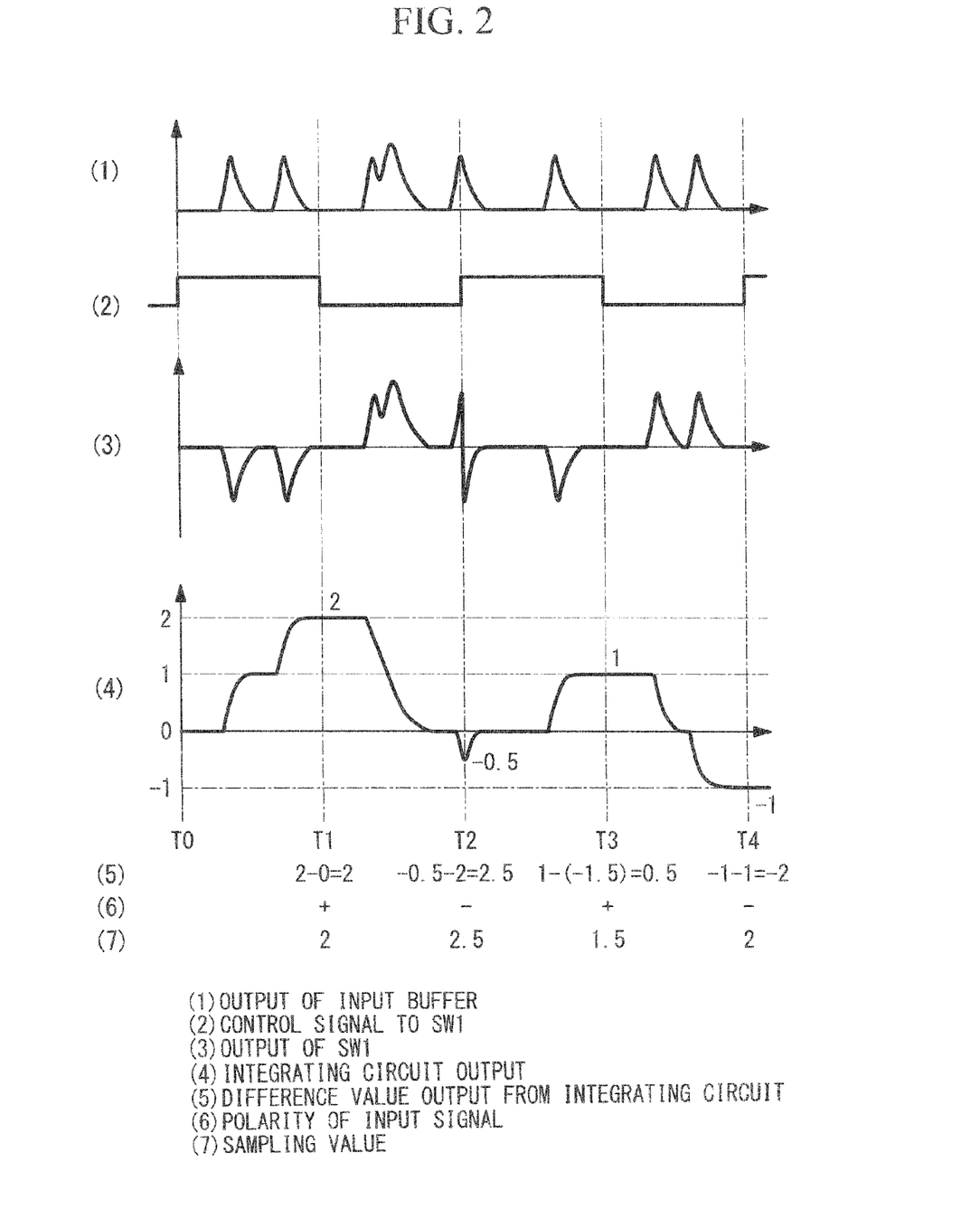
FIG. 2 is a timing chart of the sampling circuit of FIG. 1.

Specifically, as illustrated in FIG. 2, when the CPU 21 inputs a high-level control signal to the multiplexor SW1 of the polarity switcher 11 in synchronization with a sampling cycle during a first sampling period T1, i.e., at the timing of starting the first sampling period T1, the operational amplifier 6 is selected. Accordingly, the polarity of an input signal to the input buffer 10 is inverted by the operational amplifier 6, and the input signal with (+) is input to the integrating circuit 12. Then, the charge corresponding to the input signal input during the sampling period T1 is stored in the capacitor C1.

An integrated value of the input signal at the sampling start time T0 and an integrated value of the input signal at a sampling end time T1 are stored in the memory 23 of the arithmetic processor 14 via the A/D converter 13, and then, the CPU 21 obtains a difference value between the integrated value at the sampling end time T1 and the integrated value at the sampling start time T0. During the sampling period T1, the polarity of the input signal is inverted to (+). Thus, the difference in integrated value is taken as a sampling value without change, and then, is output.

Subsequently, when the CPU 21 inputs a low-level control signal to the multiplexor SW1 of the polarity switcher 11 in synchronization with a sampling cycle during a succeeding second sampling period T2, i.e., at the timing of starting the sampling period T2, the operational amplifier 5 is selected. Accordingly, the polarity of the input signal to the input buffer 10 is maintained by the operational amplifier 5, and the input signal with the polarity of (−) is input to the integrating circuit 12. Then, the charge corresponding to the input signal is stored in the capacitor C1.

Since the integrated value of the input signal at the sampling start time T1 is stored in the memory 23 at the end of the preceding first sampling period T1, only an integrated value at a sampling end time T2 is stored in the memory 23 of the arithmetic processor 14 via the A/D converter 13. Then, the CPU 21 obtains a difference value between the integrated value at the sampling end time T2 and the integrated value at the sampling start time T1. Since the polarity of the input signal is maintained at (−) during the second sampling period T2, the value obtained by multiplying the difference value by the polarity of (−) is output as a sampling value. The same sampling processing is also performed in transitioning to a third sampling period T3.

In the abovementioned manner, in the integrating circuit 12, the arithmetic processor 14 controls the polarity switcher 11 to alternately invert the polarity of the input signal every sampling period in synchronization with the sampling cycle. Thus, in the continuous sampling periods, the integration direction in the integrating circuit 12 is reversed. That is, in the integrating circuit 12, the integration direction is alternately reversed during the continuous sampling periods. Consequently, saturation in the integrating circuit can be avoided, and sampling can be continuously performed at high speed without resetting the integrating circuit every unit sampling period.

Moreover, the circuit configuration for resetting the integrating circuit every sampling period is not required. This leads to reduction in the number of components of the entire sampling circuit, and therefore, the circuit configuration can be simplified. In addition, since the end of the preceding sampling period and the start of the succeeding sampling period are coincident with each other, sampling can be continuously performed with a shortened dead time.

The sampling circuit of the present embodiment is applicable to, e.g., a laser scanning microscope. In this case, a current signal from a photoelectric conversion device for detecting, e.g., light returning from a sample, such as a photodiode (PD), a photomultiplier tube (PMT), or an avalanche photodiode (APD), is input to the sampling circuit as an input signal. Then, in the integrating circuit 12, a charge of a single pixel is stored in the capacitor C1. In other words, for each pixel, the input signal is integrated with respect to time. Then, the integrated value corresponding to the amount of charge stored in the capacitor C1 is output.

The sampling circuit of the present embodiment is preferably applied to the laser scanning microscope. This is because the integrated value output from the integrating circuit is normalized with respect to the time of the sampling period corresponding to the integrated value to reduce the influence of transition of the sampling period.

In the laser scanning microscope, when laser scanning is performed by a scanning means using mechanical resonance to perform line scanning for each pixel in the horizontal direction, a sampling period is not always maintained constant. That is, a scanning speed is faster in the vicinity of the middle of each line, and is slower at both ends of each line. This leads to variation in scanning speed. For such reasons, an operation time for each pixel varies depending on locations. The operation time is shorter in the vicinity of the center of an image, and is longer at ends of the image. When imaging is performed based merely on an integrated value, an uneven tone of color is caused depending on locations. Thus, as described above, the integrated value is normalized with respect to the time of the sampling period corresponding to the integrated value to reduce the influence of variation of the sampling period.

Second Embodiment

Figure 3:
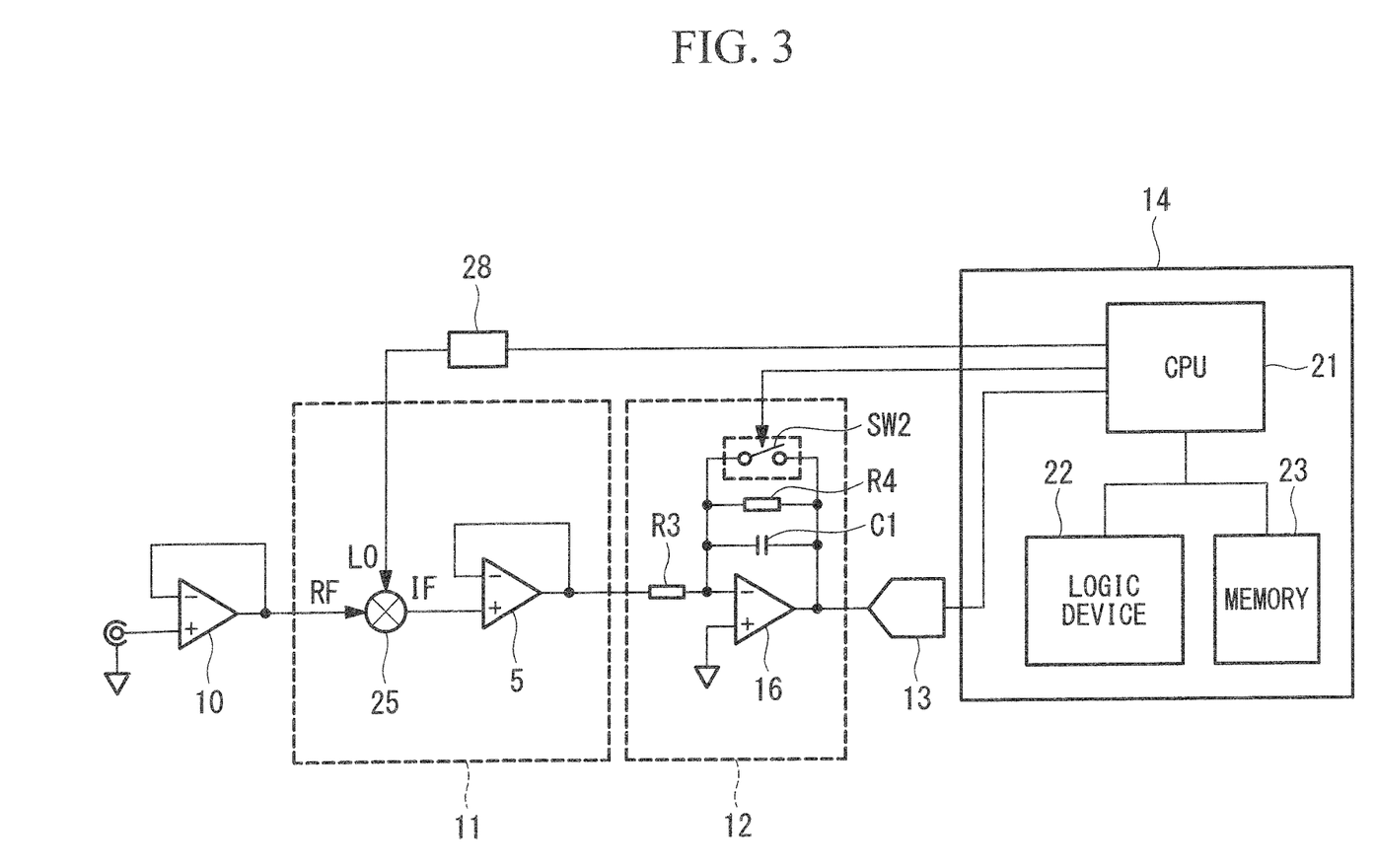
FIG. 3 is a schematic configuration diagram of a sampling circuit of a second embodiment of the present disclosure.

Next, a sampling circuit of a second embodiment of the present disclosure will be described with reference to drawings. The sampling circuit of the present embodiment is different from the abovementioned sampling circuit of the first embodiment of the present disclosure in the configurations of a polarity switcher 11 and an integrating circuit 12. Moreover, a local oscillator (hereinafter referred to as LO) signal generator 28 configured to convert a control signal from an arithmetic processor 14 into a LO signal is added to the polarity switcher 11.

In the description below, the same reference numerals as those in the sampling circuit of the first embodiment described above are used to represent equivalent elements in the configuration of the sampling circuit of the present embodiment, and the description thereof will not be repeated.

As illustrated in FIG. 3, the polarity switcher 11 includes an operational amplifier 5 as a non-inverting amplifier circuit with an inverting input terminal (−), a non-inverting input terminal (+), and an output terminal, and a double balanced mixer (hereinafter referred to as a "DBM") 25 configured to switch the polarity of an input signal input to the operational amplifier 5 according to a LO signal. In the DBM 25, when the LO signal input from a CPU 21 of the arithmetic processor 14 via the LO signal generator 28 is a low-level signal, the polarity of the input signal is inverted. When such a LO signal is a high-level signal, the polarity of the input signal is maintained.

Note that the LO signal output from the LO signal generator 28 is obtained in such a manner that a control signal output from the CPU 21 is converted according to such a control signal by the LO signal generator 28 provided between the CPU 21 and the DBM 25. That is, according to the control signal from the CPU 21, the control signal is converted into the LO signal in the LO signal generator 28, and then, the converted signal is output to the DBM 25.

The integrating circuit 12 includes an operational amplifier 16 functioning as an amplifier circuit, a capacitor C1 configured to store the charge corresponding to the input signal, a resistor R3 provided on an input side of the operational amplifier 16 and configured to convert a voltage signal as the input signal into a charge signal to be stored in the capacitor C1, a resistor R4 configured to prevent saturation of the integrating circuit 12 due to the offset of the operational amplifier 16, and a reset switch SW2 configured to reset the integrating circuit 12.

The product of the capacitance of the capacitor C1 and the resistance of the resistor R4 is set sufficiently greater than the inverse of the frequency in the frequency band of the input signal and the integration period. Moreover, the integrating circuit 12 of the present embodiment integrates an input with a sign (+) in a negative direction. Thus, in the present embodiment, the polarity of the input signal from the operational amplifier 16 is defined as (+), and the polarity of the input signal from the operational amplifier 5 is defined as (−).

The operational amplifier 16 includes an inverting input terminal (−), a non-inverting input terminal (+), and an output terminal. The capacitor C1 and the reset switch SW2 are connected in parallel between the inverting input terminal (−) and the output terminal of the operational amplifier 16. The non-inverting input terminal (+) of the operational amplifier 16 is connected to the ground.

The function of the sampling circuit configured as described above will be described below.

When sampling is performed by the sampling circuit of the present embodiment, an input signal such as a current signal is first input to the polarity switcher 11 via an input buffer 10.

A control signal is output from the CPU 21 of the arithmetic processor 14 in synchronization with a sampling cycle. Subsequently, the control signal is converted into a LO signal by the LO signal generator 28, and then, is input to the polarity switcher 11. Meanwhile, in the polarity switcher 11, the input signal is input to the DBM 25, and the input signal whose polarity is changed according to the LO signal is output from the DBM 25 to the integrating circuit 12.

When the input signal from the DBM 25 is input to the integrating circuit 12, the resistor R3 converts the input signal into a charge to be stored in the capacitor C1, and then, the charge corresponding to the input signal is stored in the capacitor C1. An integrated value of the input signal corresponding to the amount of charge stored in the capacitor C1 is output to an A/D converter 13 via the output terminal of the operational amplifier 16.

After charging the capacitor C1 for the unit sampling period, the integrated value of the input signal at an end time Tn+1 of the sampling period is stored in a memory 23. Then, a control signal for a succeeding sampling period is output from the CPU 21 to the LO signal generator 28 in synchronization with the start of the succeeding sampling period. The control signal output from the CPU 21 at this point is a control signal with the polarity opposite to that in the preceding sampling period.

Thus, the input signal is input to the integrating circuit 12 during the continuous sampling periods such that the polarity of the input signal is alternately inverted. Thus, in the sampling circuit, an integration direction in the integrating circuit 12 is reversed every sampling period, and such reversing of the integration direction is repeated.

The CPU 21 controls the A/D converter 13 to perform A/D conversion of the integrated value of the input signal input from the integrating circuit 12, and then, the A/D-converted integrated value of the input signal is output to the arithmetic processor 14. Of the integrated values of the input signal output from the A/D converter 13, the difference between the integrated value at a start time Tn of the unit sampling period and the integrated value at the end time Tn+1 of the unit sampling period is computed by the arithmetic processor 14.

As in the first embodiment described above, in the present embodiment, the end time of the preceding sampling period and the start time of the succeeding sampling period are the same between the continuous sampling periods. That is, an end time of a n-th sampling period and a start time of a n+1-th sampling period are the same as each other. Thus, the output value from the integrating circuit 12 at the start or end time of the sampling period constantly stored in the memory 23 allows computation of a difference value of the integration values at the start and end times of the unit sampling period.

Then, when the difference value is obtained by the CPU 21, the difference value is multiplied by the polarity of the input signal in the target sampling period, and then, the obtained value is output as a sampling value.

Figure 4:
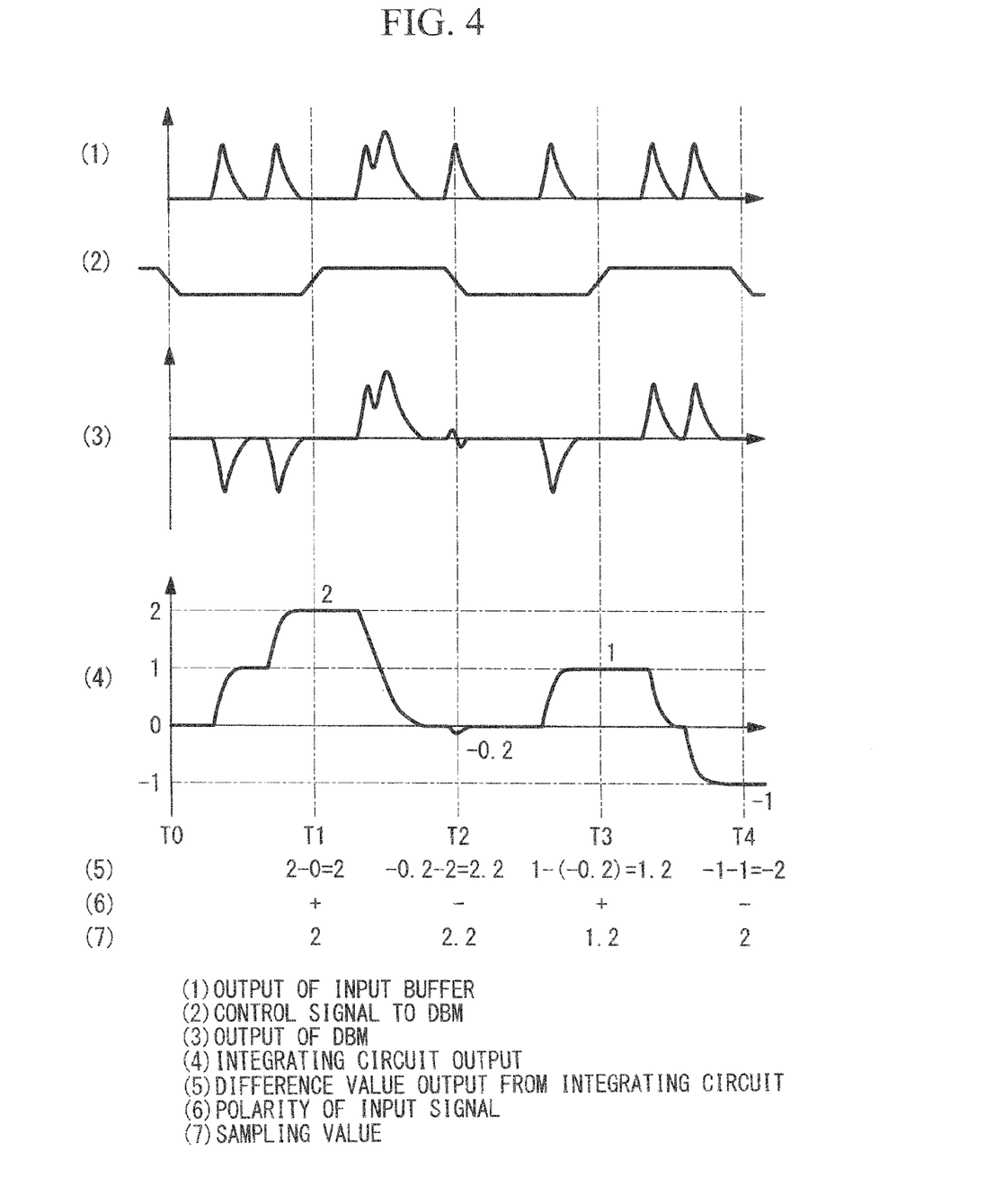
FIG. 4 is a timing chart of the sampling circuit of FIG. 3.

Specifically, as illustrated in FIG. 4, the CPU 21 inputs a low-level control signal to the LO signal generator 28 in synchronization with a sampling cycle during a first sampling period T1, i.e., at the timing of starting the first sampling period T1, and a low-level LO signal is input to the DBM 25 accordingly. Thus, in the DBM 25, the polarity of an input signal input to the input buffer 10 is inverted, and the input signal with (+) is output to the integrating circuit 12. In the integrating circuit 12, the charge corresponding to the input signal input during the sampling period T1 is stored in the capacitor C1.

An integrated value of the input signal at a sampling start time T0 and an integrated value of the input signal at a sampling end time T1 are stored in the memory 23 of the arithmetic processor 14 via the A/D converter 13, and then, the CPU 21 obtains a difference value between the integrated value at the sampling end time T1 and the integrated value at the sampling start time T0. During the sampling period T1, the polarity of the input signal is inverted to (+). Thus, the difference in integrated value is taken as a sampling value without change, and then, is output.

Subsequently, the CPU 21 inputs a high-level control signal to the LO signal generator 28 in synchronization with a sampling cycle during a succeeding second sampling period T2, i.e., at the timing of starting the sampling period T2, and a high-level LO signal is input to the DBM 25 accordingly. The polarity of the input signal to the input buffer 10 is maintained at the DBM 25, and the input signal with the polarity of (−) is input to the integrating circuit 12. Then, the charge corresponding to the input signal is stored in the capacitor C1.

Since the integrated value of the input signal at the sampling start time T2 is stored in the memory 23 at the end of the preceding first sampling period T1, only an integrated value at a sampling end time T2 is stored in the memory 23 of the arithmetic processor 14 via the A/D converter 13. Then, the CPU 21 obtains a difference value between the integrated value at the sampling end time T2 and the integrated value at the sampling start time T1. Since the polarity of the input signal is maintained at (−) during the second sampling period T2, the value obtained by multiplying the difference value by the polarity of (−) is output as a sampling value. The same sampling processing is also performed in transitioning to a subsequent third sampling period T3.

Note that the reset switch SW2 can be used to eliminate charge deviation of the integrating circuit prior to the start of sampling in supplying power to the sampling circuit or continuously performing sampling, and is not necessarily applied for each unit sampling period.

In the abovementioned manner, in the integrating circuit 12, the arithmetic processor 14 controls the polarity switcher 11 to alternately invert the polarity of the input signal every sampling period in synchronization with the sampling cycle. Thus, in the continuous sampling periods, the integration direction in the integrating circuit 12 is reversed. That is, in the integrating circuit 12, the integration direction is alternately reversed during the continuous sampling periods. Consequently, saturation in the integrating circuit can be avoided, and sampling can be continuously performed at high speed without resetting the integrating circuit every unit sampling period.

Third Embodiment

Next, a sampling circuit of a third embodiment of the present disclosure will be described with reference to drawings.

Figure 5:
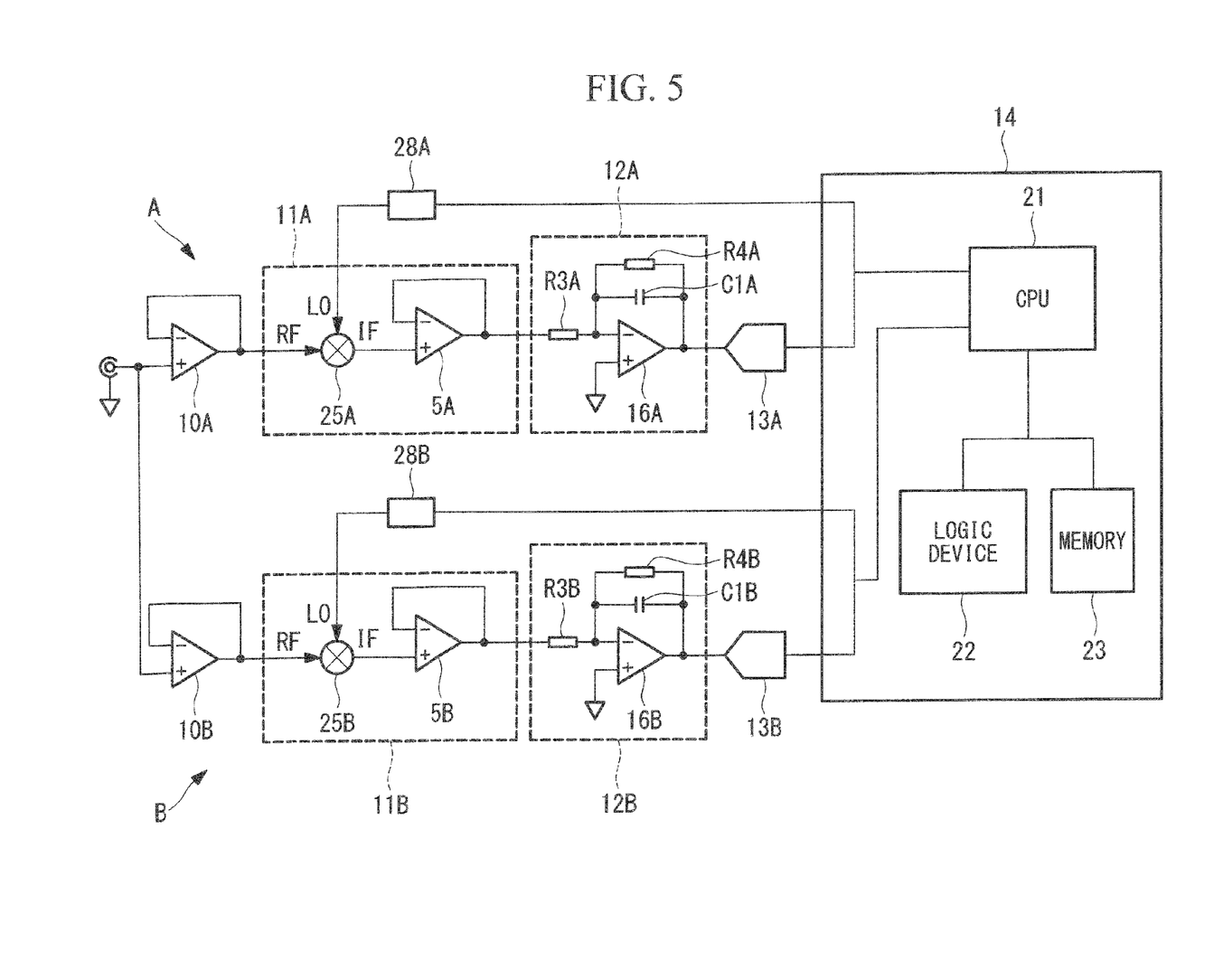
FIG. 5 is a schematic configuration diagram of a sampling circuit of a third embodiment of the present disclosure.

The sampling circuit of the present embodiment is, as illustrated in FIG. 5, configured such that two systems A, B each including the input buffer 10, the polarity switcher 11, and the integrating circuit 12 of the second embodiment described above are provided and that the integrating circuits of the systems A, B are controlled by an arithmetic processor 14.

That is, an input signal is input to each of two input buffers 10A, 10B, and the timing of inputting a LO signal to a DBM 25A of one of the systems and the timing of inputting a LO signal to a DBM 25B of the other system are shifted by a single sampling period. Moreover, the integrating circuits of the two systems are alternately used, leading to elimination of a dead time of the sampling circuit due to a transition period of the LO signal.

In the description below, the same reference numerals as those in the sampling circuits of the first and second embodiments described above are used to represent equivalent elements in the present embodiment, and the description thereof will not be repeated.

The function of the sampling circuit of the present embodiment will be described below.

When sampling is performed by the sampling circuit of the present embodiment, an input signal such as a current signal is first input to each of polarity switchers 11A, 11B via a corresponding one of the input buffers 10A, 10B.

A control signal is output from a CPU 21 of the arithmetic processor 14 to each of the systems A, B in synchronization with a sampling cycle. Subsequently, each control signal is converted into a LO signal by a LO signal generator 28A, 28B, and then, is input to the polarity switcher 11A, 11B. Meanwhile, in each of the polarity switchers 11A, 11B, the input signal is input to the DBM 25A, 25B, and the input signal whose polarity is changed according to the LO signal is output to an integrating circuit 12A, 12B via an OP amp 5A, 5B.

When the input signal from the DBM 25A, 25B is input to the integrating circuit 12A, 12B, a resistor R3A, R3B converts the input signal into a charge to be stored in a capacitor C1A, C1B, and then, the charge corresponding to the input signal is stored in the capacitor C1A, C1B. An integrated value of the input signal corresponding to the amount of charge stored in the capacitor C1A, C1B is output to an A/D converter 13A, 13B via an output terminal of an operational amplifier 16A, 16B.

After charging the capacitor C1 for the unit sampling period, the integrated value of the input signal at an end time Tn+1 of the sampling period is stored in a memory 23. Then, a control signal for a succeeding sampling period is output from the CPU 21 to each of the LO signal generators 28A, 28B in synchronization with the start of the succeeding sampling period. The control signal output from the CPU 21 at this point is a control signal with the polarity opposite to that in the preceding sampling period, or a signal for transition.

Thus, the input signal is input to each of the integrating circuits 12A, 12B during the continuous sampling periods such that the polarity of the input signal is alternately inverted. Thus, in the sampling circuit, an integration direction in each of the integrating circuits 12A, 12B is reversed every sampling period, and such reversing of the integration direction is repeated.

The CPU 21 controls each of the A/D converters 13A, 13B to perform A/D conversion of the integrated value of the input signal input from a corresponding one of the integrating circuits 12A, 12B, and then, the A/D-converted integrated value of the input signal is output to the arithmetic processor 14. Of the integrated values of the input signal output from the A/D converters 13A, 13B, the difference between the integrated value at a start time Tn of the unit sampling period and the integrated value at the end time Tn+1 of the unit sampling period is computed by the arithmetic processor 14.

As in the first and second embodiments described above, in the present embodiment, the end time of the preceding sampling period and the start time of the succeeding sampling period are the same between the continuous sampling periods. That is, an end time of a n-th sampling period and a start time of a n+1-th sampling period are the same as each other. Thus, the output value from the integrating circuit 12 at the start or end time of the sampling period constantly stored in the memory 23 allows computation of a difference value of the integration values at the start and end times of the unit sampling period.

Then, when the difference value is obtained by the CPU 21, the difference value is multiplied by the polarity of the input signal in the target sampling period, and then, the obtained value is output as a sampling value.

Figure 6:
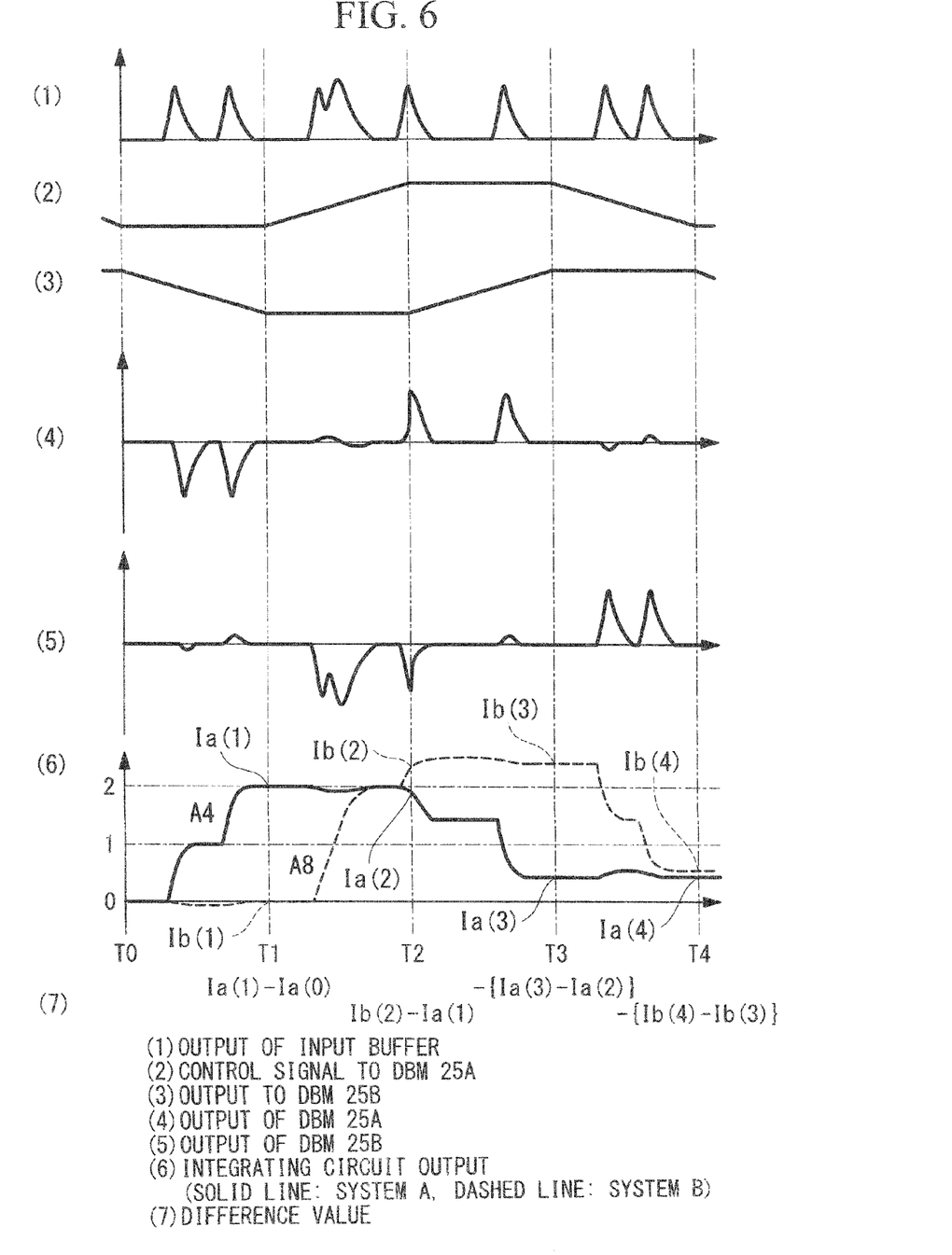
FIG. 6 is a timing chart of the sampling circuit of FIG. 5.

Specifically, as illustrated in FIG. 6, in the system A, the CPU 21 inputs a low-level control signal to the LO signal generator 28A in synchronization with a sampling cycle during a first sampling period T1, i.e., at the timing of starting the first sampling period T1, and a low-level LO signal is input to the DBM 25A accordingly. Thus, in the DBM 25A, the polarity of an input signal input to the input buffer 10A is inverted, and the input signal with (+) is output to the integrating circuit 12A. In the integrating circuit 12A, the charge corresponding to the input signal input during the sampling period T1 is stored in the capacitor C1A.

An integrated value of the input signal at a sampling start time T0 and an integrated value of the input signal at a sampling end time T1 are stored in the memory 23 of the arithmetic processor 14 via the A/D converter 13A, and then, the CPU 21 obtains a difference value between the integrated value at the sampling end time T1 and the integrated value at the sampling start time T0. During the sampling period T1, the polarity of the input signal is inverted to (+). Thus, the difference in integrated value is taken as a sampling value without change, and then, is output.

Meanwhile, in the system B, the CPU 21 inputs a control signal for transitioning a LO signal from a high level to a low level to the LO signal generator 28B in synchronization with the sampling cycle, i.e., at the timing of starting the first sampling period T1, and a LO signal in transition is input to the DBM 25B accordingly. In the case of the LO signal being in transition, only an integrated value at the end of the sampling period T1 in the integrating circuit 12B is stored in the memory 23, computation such as obtaining of a difference value by the arithmetic processor 14 is not performed.

Subsequently, in the system A, the CPU 21 inputs a control signal for transitioning a LO signal from a low level to a high level to the LO signal generator 28A in synchronization with a sampling cycle during a succeeding second sampling period T2, i.e., at the timing of starting the second sampling period T2, and a LO signal in transition is input to the DBM 25A accordingly. In the case of the LO signal being in transition, only an integrated value at the end of the sampling period T2 in the integrating circuit 12A is stored in the memory 23, computation such as obtaining of a difference value by the arithmetic processor 14 is not performed.

In the system B, the CPU 21 inputs a low-level control signal to the LO signal generator 28B in synchronization with the sampling cycle, i.e., at the timing of starting the sampling period T2, and a low-level LO signal is input to the DBM 25B accordingly. The polarity of the input signal to the input buffer 10B is inverted to (+) at the DBM 25B, and the input signal with (+) is output to the integrating circuit 12B. Then, in the integrating circuit 12B, the charge corresponding to the input signal input during the sampling period T2 is stored in the capacitor C1B.

An integrated value at a sampling end time T2 is stored in the memory 23 of the arithmetic processor 14 via the A/D converter 13A, and then, the CPU 21 obtains a difference value between the integrated value at the sampling end time T2 and the integrated value at the sampling start time T1. During the sampling period T2, the polarity of the input signal is inverted to (+). Thus, the difference in integrated value is taken as a sampling value without change, and then, is output.

Subsequently, in the system A, the CPU 21 inputs a high-level control signal to the LO signal generator 28A in synchronization with a sampling cycle during a succeeding third sampling period T3, i.e., at the timing of starting the third sampling period T3, and a high-level LO signal is input to the DBM 25A accordingly. The polarity of the input signal to the input buffer 10A is maintained at the DBM 25A, and the input signal with the polarity of (−) is input to the integrating circuit 12A. Then, the charge corresponding to the input signal is stored in the capacitor C1A.

Since the integrated value of the input signal at a sampling start time T3 is stored in the memory 23 at the end of the preceding second sampling period T2, only an integrated value at a sampling end time T3 is stored in the memory 23 of the arithmetic processor 14 via the A/D converter 13A. Then, the CPU 21 obtains a difference value between the integrated value at the sampling end time T3 and the integrated value at the sampling start time T2. Since the polarity of the input signal is maintained at (−) during the third sampling period T3, the value obtained by multiplying the difference value by the polarity of (−) is output as a sampling value.

Meanwhile, in the system B, the CPU 21 inputs a control signal for transitioning a LO signal from a low level to a high level to the LO signal generator 28B in synchronization with the sampling cycle, i.e., at the timing of starting the third sampling period T3, and a LO signal in transition is input to the DBM 25B accordingly. In the case of the LO signal being in transition, only an integrated value at the end of the sampling period T3 in the integrating circuit 12B is stored in the memory 23, computation such as obtaining of a difference value by the arithmetic processor 14 is not performed.

Subsequently, in the system A, the CPU 21 inputs a control signal for transitioning a LO signal from a high level to a low level to the LO signal generator 28A in synchronization with a sampling cycle during a succeeding fourth sampling period T4, i.e., at the timing of starting the fourth sampling period T4, and a LO signal in transition is input to the DBM 25A accordingly. In the case of the LO signal being in transition, only an integrated value at the end of the fourth sampling period T4 in the integrating circuit 12A is stored in the memory 23, computation such as obtaining of a difference value by the arithmetic processor 14 is not performed.

Meanwhile, in the system B, the CPU 21 inputs a high-level control signal to the LO signal generator 28B in synchronization with the sampling cycle, i.e., at the timing of starting the sampling period T4, and a high-level LO signal is input to the DBM 25B accordingly. The polarity of the input signal to the input buffer 10B is maintained at the DBM 25B, and the input signal with the polarity of (−) is input to the integrating circuit 12B. Then, the charge corresponding to the input signal is stored in the capacitor C1B.

Since the integrated value of the input signal at a sampling start time T4 is stored in the memory 23 at the end of the preceding third sampling period T3, only an integrated value at a sampling end time T4 is stored in the memory 23 of the arithmetic processor 14 via the A/D converter 13A. Then, the CPU 21 obtains a difference value between the integrated value at a sampling end time T4 and the integrated value at the sampling start time T3. Since the polarity of the input signal is maintained at (−) during the fourth sampling period T4, the value obtained by multiplying the difference value by the polarity of (−) is output as a sampling value.

The same sampling processing is also performed for a fifth sampling period T5 and subsequent periods thereto.

Note that the reset switches SW2A, SW2B can be used to eliminate charge deviation of the integrating circuit prior to the start of sampling in supplying power to the sampling circuit or continuously performing sampling, and is not necessarily applied for each unit sampling period.

As described above, in each of the integrating circuits 12A, 12B, the arithmetic processor 14 controls the polarity switcher 11A, 11B to alternately invert the polarity of the input signal every sampling period in synchronization with the sampling cycle. Thus, in the continuous sampling periods, the integration direction in each of the integrating circuits 12A, 12B is reversed. Consequently, saturation in the integrating circuit can be avoided, and sampling can be continuously performed at high speed without resetting the integrating circuit every unit sampling period.

In addition, the plurality of integrating circuits are provided, leading to elimination of a dead time of the sampling circuit due to transition of a LO signal.

In the abovementioned aspect, the polarity switcher may include at least two polarity switchers, the integrating circuit may include at least two integrating circuits, and the integrating circuit to be applied may be different among continuous sampling periods to output integrated values.

This allows sampling by one of the circuits when the other circuit is used for polarity switching. Consequently, a dead time in polarity switching during the sampling period can be eliminated.

In the abovementioned aspect, the integrated values output from the integrating circuit may be normalized with respect to a time of the sampling period corresponding to the integrated values.

This can reduce the influence of transition of the sampling period. For example, when the sampling circuit of the present disclosure is applied to a laser scanning microscope, the sampling period is not always maintained constant. In the laser scanning microscope, when laser scanning is performed by a scanning means using mechanical resonance to perform line scanning for each pixel in the horizontal direction, a scanning speed is faster in the vicinity of the middle of each line, and is slower at both ends of each line. This leads to variation in operation time for each pixel varies depending on locations. The operation time is shorter in the vicinity of the center of an image, and is longer at ends of the image. When imaging is performed based merely on an integrated value, an uneven tone of color is caused depending on locations. Thus, normalization as in the present disclosure reduces the influence of transition of the sampling period.

In the abovementioned aspect, the sampling circuit may further include a resetting section configured to reset the integrating circuit.

This can eliminate charge deviation of the integrating circuit prior to the start of sampling in supplying power to the sampling circuit or continuously performing sampling.

Advantageous Effects of Invention

According to the present disclosure, there is an advantage that sampling can be continuously performed at high speed with a simple configuration.

According to the present disclosure, there is an advantage that sampling can be continuously performed at high speed with a simple configuration.

REFERENCE SIGNS LIST

10 Input Buffer (Input section)
11 Polarity Switcher
12 Integrating Circuit
13 A/D Converter
14 Arithmetic Processor (Computing Section, Control Section)

The invention claimed is:

1. A sampling circuit comprising:
   a polarity switcher configured to invert or non-invert a polarity of an input signal to output the inverted or non-inverted signal;
   an integrating circuit configured to integrate the signal output from the polarity switcher to output integrated values;
   a computing section configured to compute a sampling value every predetermined sampling period, the sampling value being obtained in such a manner that a difference value between an integrated value which is one of the integrated values output from the integrating circuit at a start of the sampling period and an integrated value which is another one of the integrated values output from the integrating circuit at an end of the sampling period is multiplied by a sign corresponding to the polarity set by the polarity switcher; and
   a control section configured to control the polarity switcher to alternately invert the polarity of the input signal every sampling period in synchronization with a sampling cycle.

2. The sampling circuit of claim 1, wherein
   the polarity switcher includes at least two polarity switchers,
   the integrating circuit includes at least two integrating circuits, and
   the integrating circuit to be applied differs between continuous sampling periods to output integrated values.

3. The sampling circuit of claim 1, wherein
   the integrated values output from the integrating circuit are normalized with respect to a time of the sampling period corresponding to the integrated values.

4. The sampling circuit of claim 1, further comprising:
   a resetting section configured to reset the integrating circuit.

* * * * *